US006366861B1

(12) United States Patent
Waldhauer et al.

(10) Patent No.: US 6,366,861 B1
(45) Date of Patent: *Apr. 2, 2002

(54) METHOD OF DETERMINING A WAFER CHARACTERISTIC USING A FILM THICKNESS MONITOR

(75) Inventors: Ann P. Waldhauer, La Honda; Norma B. Riley, Pleasanton; Paul B. Comita, Menlo Park, all of CA (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/845,589

(22) Filed: Apr. 25, 1997

(51) Int. Cl.[7] ............................................. G01B 11/02
(52) U.S. Cl. .......................... 702/35; 702/81; 702/170; 702/172; 356/630; 356/632; 250/559.27
(58) Field of Search ................... 702/35, 34, 40, 702/42, 43, 71, 76, 77, 81–84, 97, 117, 159, 157, 170–172, 183, 185, 193, FOR 148, FOR 137; 364/468.16, 468.17, 468.27, 468.28; 324/699, 76.19, 76.21, 76.22, 229, 230, 237, 238, 240, 662, 671, 716–718; 356/381, 382, 303, 237.1, 630, 632; 438/16–18; 250/559.27, 559.2; 700/109, 110, 119, 120, 121, 123

(56) References Cited

U.S. PATENT DOCUMENTS

| | | | | |
|---|---|---|---|---|
| 5,365,340 A | * | 11/1994 | Ledger | 356/382 |
| 5,493,401 A | * | 2/1996 | Horie et al. | 356/382 |
| 5,573,624 A | * | 11/1996 | Barbee et al. | 438/17 |
| 5,587,792 A | * | 12/1996 | Nishizawa et al. | 250/559.27 |
| 5,717,490 A | * | 2/1998 | Kumar | 356/382 |
| 5,866,917 A | * | 2/1999 | Suzuhi et al. | 356/382 |
| 5,924,058 A | * | 7/1999 | Waldhauer et al. | 702/170 |

OTHER PUBLICATIONS

Liu, Shaohua, "Technical Report of Epi–Silicon Film Measurements", Advanced Fuel Research, Inc., May 18, 1994, pp. 1–12.

Yamamoto, Kiyoshi et al., "Interpretation of Reflection and Transmission Spectra for Thin Films: Reflection", *Applied Spectroscopy*, vol. 48, No. 7, 1994, pp. 775–785.

Grosse, Peter, "FTIR–Spectroscopy of Layered Structures thin solid films, coated substrates, profiles, multilayers–", *SPIE*, 8th International Conference on Fourier Transform Spectroscopy, vol. 1575, 1991, pp. 169–179.

Fowler, Burt W. et al., "The Measurement of Sub–Micron Epitaxial Layer Thickness and Free Carrier Concentration by Infrared Reflectance Spectroscopy", *Electro–Chemical Society*, Proceedings vol. 94–33, Oct. 9–14, 1994, pp. 1–12.

* cited by examiner

*Primary Examiner*—Hal Wachsman
(74) *Attorney, Agent, or Firm*—Blakely Sokoloff Taylor & Zafman

(57) ABSTRACT

A method for determining a wafer characteristic, such as the surface quality of a film formed on the wafer, using a film thickness monitor is described. In one embodiment, the method comprises the following steps. A measured spectrum for a processed wafer is generated. A set of parameters is chosen and then used to generate a calculated spectrum. The measured spectrum is compared to the calculated spectrum to determine if the two spectra match. If the two spectra do not match or the degree of nonconformity between the two spectra is greater than an acceptable error value, then there is probably a defect with the processed wafer. For example, the film formed on the wafer may have a nonuniform or hazy surface quality.

16 Claims, 3 Drawing Sheets

METHOD OF DETERMINING A WAFER CHARACTERISTIC USING A FILM THICKNESS MONITOR

BACKGROUND OF THE INVENTION

1. Field of the Invention

The present invention relates generally to semiconductor manufacturing. More specifically, the present invention pertains to monitoring characteristics of a processed substrate.

2. Description of related art

During semiconductor device manufacturing, a film (e.g., epitaxial silicon) is often formed or grown on a wafer surface. After the film is formed on the wafer, a characteristic of the film is measured. Surface quality of the film is one such characteristic that is measured to determine if a wafer is defective.

There are several methods to determine the surface film quality of the wafer. The light scattering method involves shining a bright light onto a wafer while a highly-skilled scientist visually examines the wafer to determine surface film quality. Another method also involves a subjective visual inspection of the wafer by one skilled in the art, but under an optical microscope. Thus, both of these methods suffer from their dependence on the subjective visual inspection of a fallible human being. A third method required bringing a processed wafer to a light scattering instrument that focused laser light on the processed wafer. The amount of laser light scattered by the wafer is quantifiable and is then used to determine the surface film quality of the wafer. Unfortunately, this third method requires a very expensive light-scattering tool that is separate from the processing tool that forms the film on the wafer. This third method uses a very costly off-line metrology. Thus, it is desirable to use a tool that is already being utilized to automatically indicate a characteristic, such as the surface film quality of a processed wafer.

SUMMARY

The present invention relates to a computer-implemented method for automatically determining a characteristic of a substrate by using a film thickness monitor. In one embodiment, the film thickness monitor includes a computer system and is part of a larger processing tool. In another embodiment, the film thickness monitor and its computer system are part of an off-line metrology and are not part of a larger processing tool.

In one embodiment, the present inventive method comprises the following steps. A measured spectrum, which represents the reflectance of a sample substrate, is generated. A starting set of parameters (e.g., film thickness, substrate doping level) is chosen. A calculated spectrum is then generated according to the starting set of parameters. The difference, if any, between the measured and calculated spectra is calculated or determined. If the difference or residual error between the two spectra is not minimized, then at least one parameter is varied to generate a revised calculated spectrum. Typically, however, more than one parameter is varied (possibly more than once) before the residual error between the two spectra is minimized. The measured spectrum is then compared to the revised calculated spectrum to determine if the difference or residual error is minimized.

If the difference or residual error between the two spectra is minimized, then it must be determined whether the two spectra match well. This is because the fact that the residual error is minimized does not necessarily mean that the two spectra match well. In one embodiment, if the two spectra do not match well, which usually means there is a residual error greater than a predetermined acceptable residual error value, then the sample substrate probably has a defect or problem. Further tests can be run to pinpoint the exact cause or nature of the problem. The problem can typically be haze or poor surface quality of the sample substrate.

On the other hand, if the two spectra match well or correlate, then the sample substrate is probably acceptable and generally has the characteristics of the parameters used to generate the calculated spectrum. In other words, the residual error between the two spectra falls within an acceptable range and indicates a "good fit" between the two spectra. Thus, the present invention uses a film thickness monitor to quickly and automatically determine if a sample substrate has a defect without depending on an additional and costly instrument or on a fallible human being.

BRIEF DESCRIPTION OF THE DRAWINGS

The present invention is illustrated by way of example and not a limitation in the figures of the accompanying drawings in which like references indicate similar elements. In addition, some of the elements in the figures are not drawn to scale and may appear larger for the sake of clarity.

DETAILED DESCRIPTION

A method is described for conveniently determining a wafer characteristic. In the following description, numerous specific details are given to provide a thorough understanding of the invention. It will, however, still be apparent to one skilled in the art that the invention may be practiced without these specific details. Moreover, in some instances, well-known semiconductor equipment and processes have not been set forth in detail in order not to unnecessarily obscure the present invention.

The present invention provides several advantages over the prior art. In one embodiment, the present invention allows automatic and convenient determination of a wafer characteristic, such as film surface quality, while also measuring another characteristic, such as film thickness. The film surface quality can be determined using an easily available and existing tool, such as a film thickness monitor. Therefore, no additional cost is incurred for another instrument or tool. Furthermore, the present inventive method is convenient because it can be implemented as part of an in-line metrology and does not depend on a fallible human being.

Figure 1:
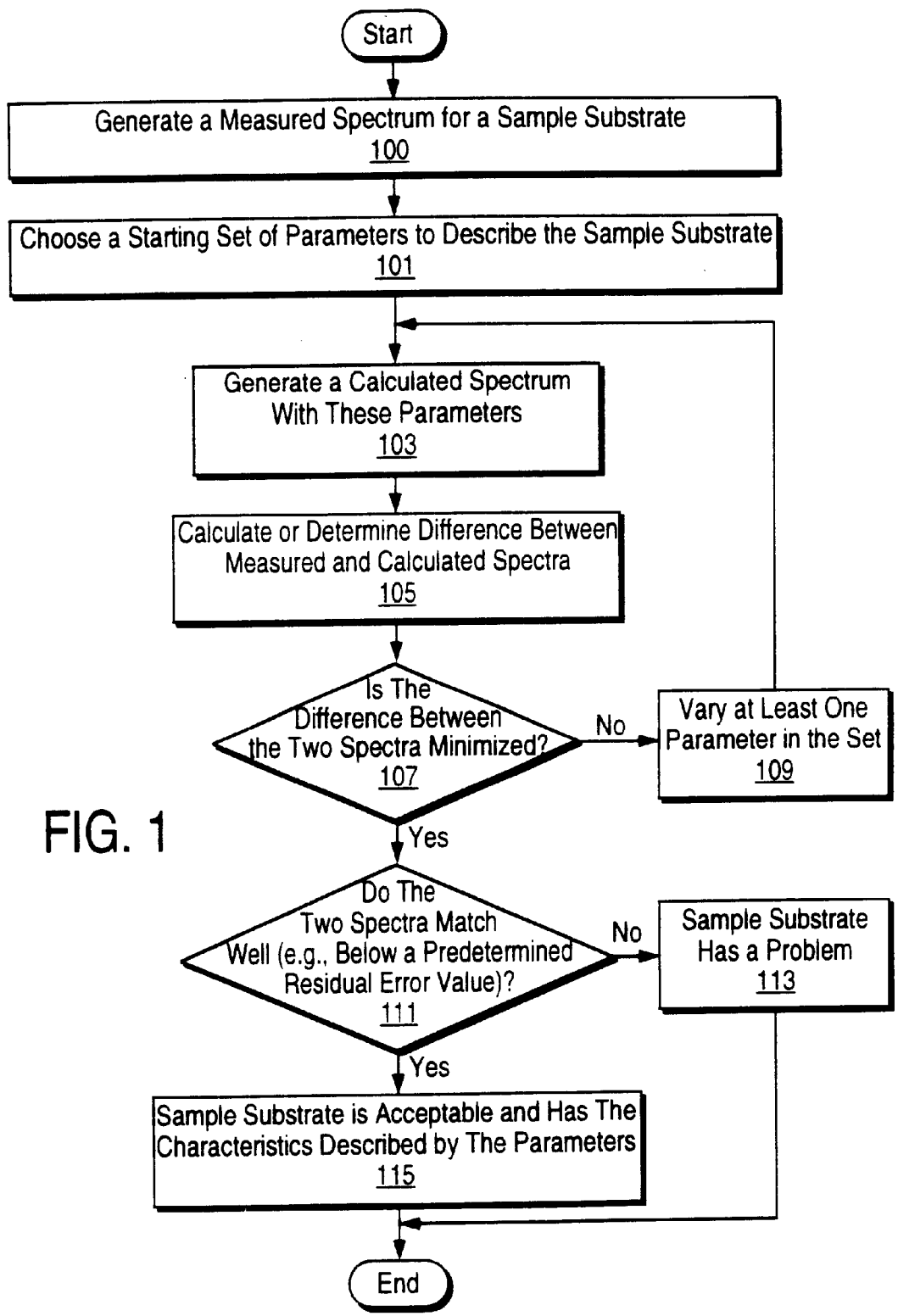
FIG. 1 is a flow chart illustrating one embodiment of the present invention.

FIG. 1 is a flowchart illustrating one embodiment of the present invention. It is to be appreciated that the flowchart shown in FIG. 1 can be utilized with a film thickness monitor as part of an in-line metrology or as part of an off-line metrology. In step 100, a measured spectrum for a sample wafer is generated according to well-known techniques. In one embodiment, the measured spectrum for a sample wafer can be generated by comparing the spectrum for the sample wafer with a reference spectrum. Next, in step 101, a starting set of parameters is chosen to describe the sample wafer. In one embodiment, the set of parameters can include, but is not limited to the following parameters: film thickness, wafer doping level, buried layer doping level and transition thickness. The transition thickness is the thickness of the interface between the film formed and the wafer. Since a characteristic of the wafer, such as film thickness is usually not known beforehand, the starting set of parameters are merely an estimation. It will be appreciated that additional parameters can also be included in the set of parameters. A calculated spectrum based on the starting set of parameters is then generated in step 103. In step 105, the difference between the measured and calculated spectra is determined or calculated according to an algorithm, which is well-known in the art.

In decision diamond 107, it must be determined whether the difference between the two spectra (i.e., the measured and calculated spectra) is minimized. The degree to which the difference between the two spectra is minimized is often characterized by a residual error value. The residual error value or error value discloses the degree of nonconformity between the measured spectrum and the calculated spectrum.

If it is determined that the difference between the two spectra is not minimized (e.g., the smallest possible residual error value is not obtained), in step 109, one of the parameters is varied. For example, the parameter of film thickness can be varied to try to minimize the difference between the calculated spectrum and the measured spectrum. In most cases, however, more than one parameter can be changed in step 109. In addition, the least squares fit is one algorithm that can be used to minimize the residual error value between the two spectra, while varying the parameters. It will be appreciated that other algorithms can be used to vary one or more parameters in an attempt to minimize the residual error value. After one or more of the parameter(s) is/are varied, then steps 103 and 105 are repeated with a revised calculated spectrum. In general, the parameters are varied until the minimum possible error value is obtained between the measured spectrum and the calculated spectrum. For example, if after varying one or more parameters several times, error values of 0.005 or greater are obtained, then the two spectra are probably minimized at an error value of 0.005. The revised calculated spectrum is generated using the varied parameter(s) generated in step 109. A revised calculated spectrum is created each time one or more parameters are changed. The revised calculated spectrum is then compared with the measured spectrum to determine whether the difference between the two spectra is minimized. If the difference is not minimized, then step 109 is repeated.

On the other hand, if it is determined that the difference between the two spectra is minimized, then in decision diamond 111, it must be determined whether the two spectra match or correlate. In other words, it must be determined whether the degree of difference between the two spectra is at or below a predetermined acceptable residual error value or range of values. If the minimized residual error value is greater than the predetermined acceptable residual error value or range of error values, then the two spectra probably do not match well. The degree to which the error value discloses a significant difference between the two spectra or indicates a problem will change depending on several factors. For example, the type of film formed on the sample wafer and the sample wafer itself can affect when a minimized residual error value will indicate a defect with the sample wafer.

In an exemplary embodiment, the cut-off range between an acceptable sample wafer and a defective sample wafer can vary. But in most cases, if the minimized residual error value is greater than 0.005, then the two spectra do not match well. In other words, there is a "bad fit" between the two spectra. For example, if a predetermined residual error value of 0.0005 is chosen, and the minimized residual error value of the two spectra is 0.11, then the two spectra do not match (i.e., a "bad fit"). In that case, in step 113, it is determined that the sample wafer has a defect. Thus, it can be quickly determined whether the sample wafer has a defect or problem. The exact identity of the defect or the problem may require further tests. If, however, it is determined that the two spectra match (i.e., a "good fit"), then in step 115, it is determined that the sample wafer is probably acceptable. It also typically means that the sample wafer most likely has at least some of the characteristics described by the parameters used to generate the calculated spectrum.

It will be appreciated by one skilled in the art that the residual error value is not the only way of determining the "fit" between the measured spectrum and the calculated spectrum. Other algorithms can also be used to measure the "fit" between the two spectra. For example, a computer can use an algorithm that can determine whether there is a "good fit" by "visually comparing" the measured spectrum to the calculated spectrum.

In one embodiment, the flow chart shown in FIG. 1 occurs within the computer system of a film thickness measurement tool, such as a Fourier Transform Infrared Radiation (FTIR) film thickness monitor that is manufactured by On-Line Technologies, Ltd., located in East Hartford, Conn. 06108. The film thickness monitor can be coupled to a larger processing tool or it can be a stand-alone tool in an off-line metrology. The flow chart of FIG. 1 can also occur, alternatively within the computer system of a larger processing tool that includes a film thickness monitor in an in-line metrology. For example, the film thickness measurement tool can be coupled to a larger processing tool such as the HT Centura, which is manufactured by Applied Materials of Santa Clara, Calif. 95051.

Figure 2:
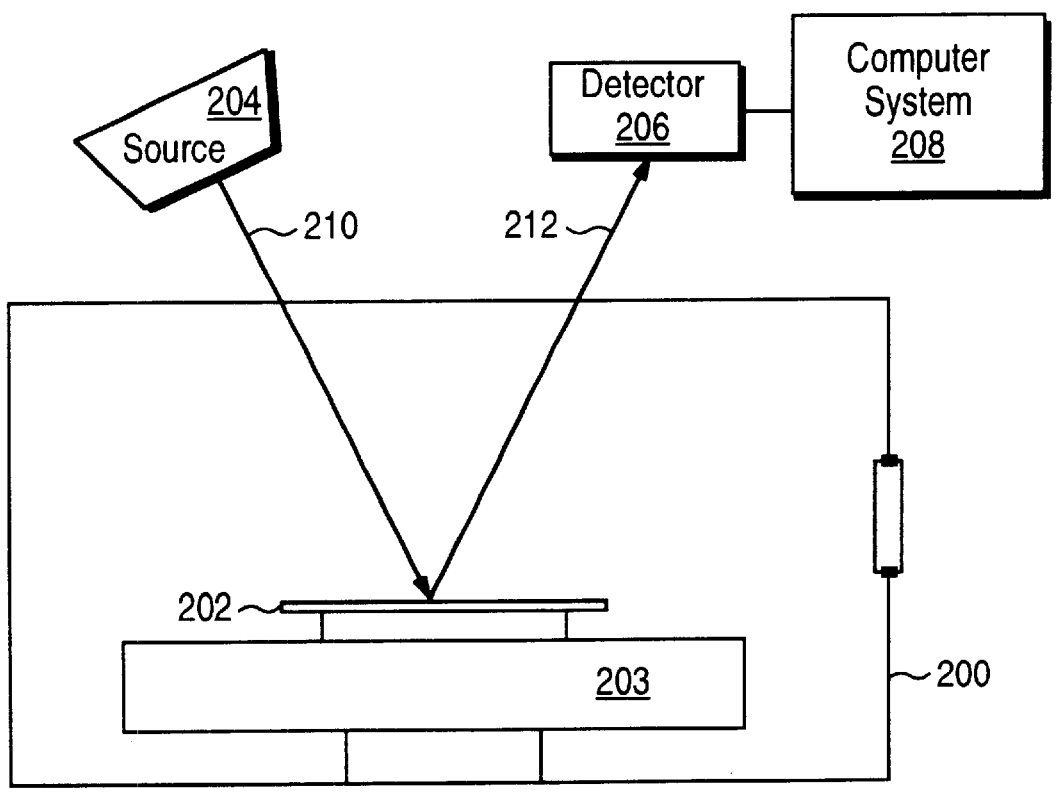
FIG. 2 is a block diagram illustrating one embodiment of the present invention.

The present invention can utilize a film thickness monitor to not only measure film thickness but also to indicate whether a sample wafer might have a defect. One embodiment of the present invention is illustrated in FIG. 2. Although the present invention can be used to determine various characteristics of a wafer, the present example will focus on the surface quality of a film formed on the wafer. It will be appreciated that various films can be formed on the wafer, such as but not limited to epitaxial silicon, undoped polysilicon, doped and undoped capped polysilicon and silicon germanium. The surface quality of the film formed on the wafer can be easily and reliably determined using the present invention.

After a film is formed on the wafer 202, it is placed on a chuck 203 within holding chamber 200. The holding chamber can be part of a larger cluster or processing tool, such as the Epi Centura, which is manufactured by Applied Materials, Santa Clara, Calif. 95051. Or in another embodiment, the holding chamber 200 can be part of a separate off-line metrology. A source 204 provides a light signal, such as infrared radiation, that passes through a wall in chamber 200 to the wafer 202. The light signal 210 directed to the wafer is then reflected 212 back to a detector 206. The detector 206 is coupled to an exemplary computer system 208.

Although the source 204 and detector 206 are shown outside the chamber 200 in FIG. 2, it is to be appreciated that the source 204 and the detector 206 can also be located within the chamber 200. In addition, source 204 and detector 206 do not necessarily have to be in a fixed position as shown in FIG. 2. Furthermore, exemplary computer system 208 can be part of a film thickness monitor or it can be part of a larger cluster or processing tool, such as the Epi Centura.

Figure 3:
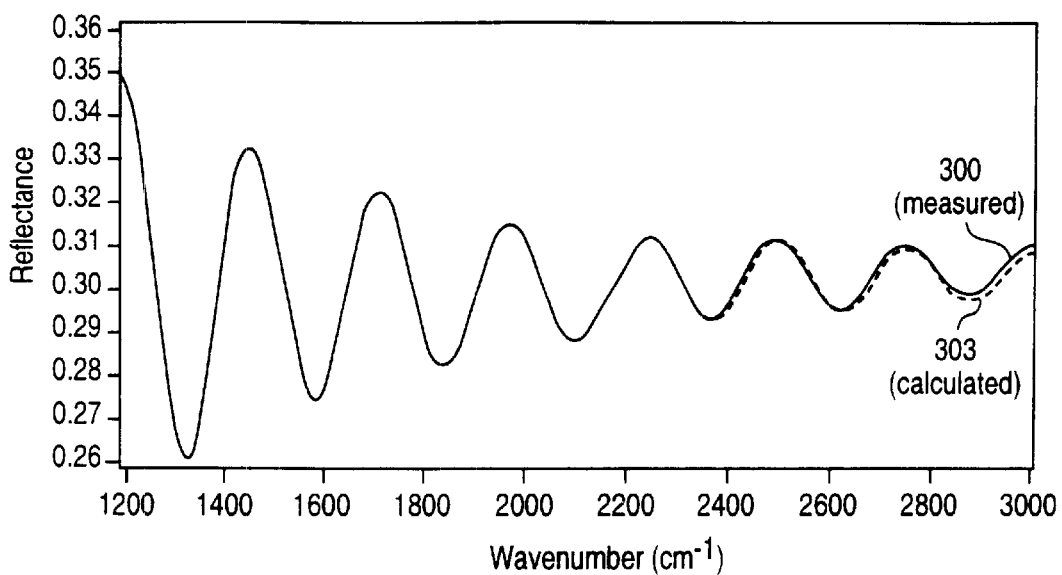
FIG. 3 illustrates a "good fit" between a measured spectrum and a calculated spectrum.

Referring to FIG. 3, a "good fit" between a measured spectrum 300 and a calculated spectrum 303 is illustrated. The measured spectrum 300 can be collected by a detector, such as detector 206 illustrated in FIG. 2. The measured spectrum 300 reveals the reflectance of a light signal, such as infrared radiation, off of a wafer, such as wafer 202 of FIG. 2. As shown in FIG. 3, the measured spectrum 300 closely tracks or follows the calculated spectrum 303. The calculated spectrum 303 is calculated or generated based on a set of parameters, such as but not limited to the following: film thickness, buried layer doping level, wafer doping level and transition thickness. A residual error value of about 0.0008 between measured spectrum 300 and calculated spectrum 303 is determined. The residual error value can be minimized using the least squares fit algorithm or some other applicable algorithm. The very small residual error value, in this case, indicates that there is a "good fit" or match between the measured spectrum 300 and the calculated spectrum 303. The X-axis of FIG. 3 represents wavenumber ($cm^{-1}$) and the Y-axis represents the reflectance. There is an average reflectance of about 0.30 for the measured spectrum 300 and the calculated spectrum 303, which means about one-third of the light signal is reflected off of the wafer.

Figure 4:
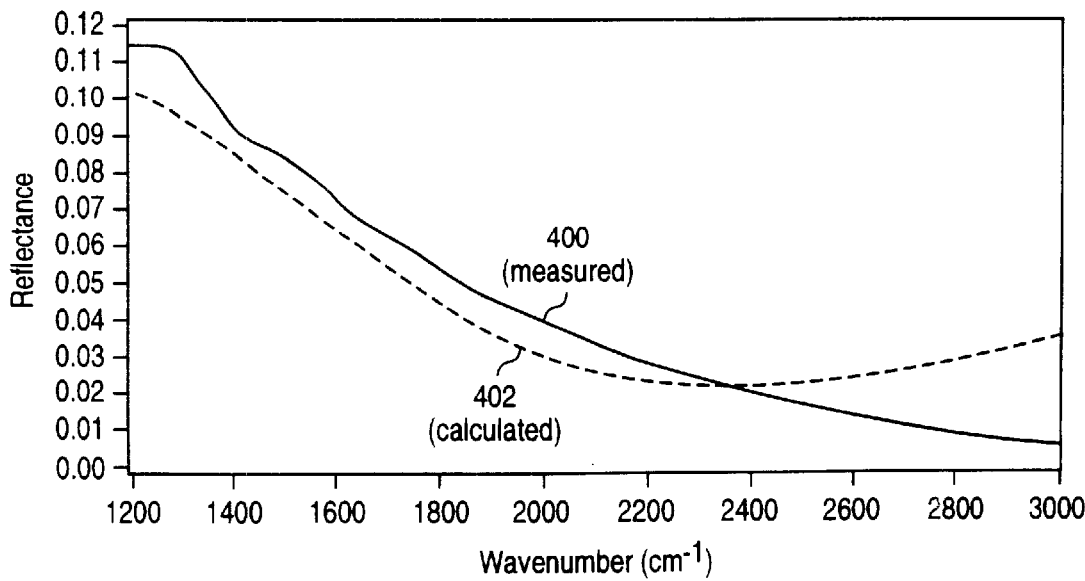
FIG. 4 illustrates a "bad fit" between a measured spectrum and a calculated spectrum.

In contrast, FIG. 4 illustrates a "bad fit" between a measured spectrum 400 and a calculated spectrum 402. Once again, the X-axis represents wavenumber ($cm^{-1}$) and the Y-axis represents reflectance. The average reflectance in FIG. 4 is about 0.05, which means very little light is reflected. FIG. 4 also has a much higher error or residual error value of about 0.1532, which in this case, indicates a poor match or "bad fit" between the measured spectrum 400 and the calculated spectrum 402. In general, a lower reflectance and a higher residual error value (as shown in FIG. 4) indicate a wafer film surface quality problem, such as nonuniformity or haze. A "bad fit" between the measured spectrum 400 and the calculated spectrum 402 can be quickly determined using a film thickness monitor arrangement as illustrated in FIG. 2. It will be appreciated that other film thickness monitor arrangements can also be used in the present invention.

In the above description, numerous specific details or examples are given to be illustrative and not limiting of the present invention. Thus, the present invention is not limited to determining the surface quality of a film formed on a processed wafer. It will also be apparent to one skilled in the art that the invention may be practiced without these specific details. Moreover, in some instances, well-known semiconductor equipment and processes have not been set forth in detail in order not to unnecessarily obscure the present invention. Thus, the method is defined by the appended claims.

What is claimed is:

1. A computer-implemented method of evaluating a wafer surface, comprising:

generating a measured spectrum from said wafer surface;

choosing a set of wafer parameters from which to calculate a spectrum;

calculating the spectrum from said set of wafer parameters;

revising said set of wafer parameters by varying at least one parameter of said set of wafer parameters;

generating a revised calculated spectrum from said set of revised wafer parameters;

revising said revised calculated spectrum until a minimized difference between said revised calculated spectrum and said measured spectrum is determined; and evaluating the quality of said wafer surface based on said minimized difference.

2. The computer-implemented method of claim 1, wherein said at least one parameter is selected from the group consisting of film thickness, substrate doping level, buried layer doping level and transition thickness.

3. The computer-implemented method of claim 1, further comprising:

evaluating said minimized difference to determine a degree of match; and determining the acceptability of said wafer surface based on said degree of match.

4. The computer-implemented method of claim 3, further comprising:

placing a film on a substrate;

wherein the measured spectrum is generated from the film on the substrate.

5. The computer-implemented method of claim 4, wherein said film is selected from a group consisting of epitaxial silicon, undoped polysilicon, doped capped polysilicon, undoped capped polysilicon and silicon germanium.

6. A computer-implemented method of evaluating a wafer, comprising:

choosing a set of wafer parameters from which to calculate a spectrum;

calculating said spectrum from said set of wafer parameters;

generating a measured spectrum from a surface of said wafer;

utilizing a film thickness monitor to compare said measured spectrum for said wafer to said calculated spectrum, wherein said surface is a film formed on said wafer before said measured spectrum is generated;

varying at least one parameter from said set of wafer parameters to generate a revised calculated spectrum;

determining when a difference between said measured spectrum and said revised calculated spectrum is minimized, wherein said minimized difference is represented by a residual error value;

determining whether said revised calculated spectrum is minimized to said measured spectrum based on said residual error value; and determining the quality of said surface based on a degree of said residual error value.

7. The computer-implemented method of claim 6, wherein a step of determining that said measured spectrum does not match with said revised calculated spectrum includes determining that said residual error value does not fall within a predetermined range of acceptable residual error values, wherein said residual error value discloses the surface quality of a measured wafer film.

8. The computer-implemented method of claim 6, wherein said at least one parameter is selected from the group consisting of film thickness, substrate doping level, buried layer doping level and transition thickness.

9. A computer-implemented method for evaluating a wafer by determining a characteristic of a wafer sample, comprising:

generating a measured spectrum from a surface of said wafer sample;

choosing a set of wafer parameters to describe a calculated spectrum;

generating said calculated spectrum from said set of wafer parameters;

choosing different values for said set of wafer parameters;

generating revised calculated spectrums from said different values for said set of wafer parameters;

determining a best fit revised calculated spectrum to said measured spectrum;

determining whether said measured spectrum and said best fit revised calculated spectrum match well; and determining the quality of said surface of said wafer sample based on a degree of said match.

10. The computer-implemented method of claim 9, further including:

determining that said best fit revised calculated spectrum and said measured spectrum is greater than an acceptable residual error value, which means said measured spectrum does not match said revised calculated spectrum.

11. The computer-implemented method of claim 9, further comprising:

determining a minimized residual error value;

determining said measured spectrum and said best fit revised calculated spectrum does not match well, said match is based upon said minimized residual error value existing outside a predetermined acceptable range; and determining that said wafer has a defect based upon said match.

12. The computer-implemented method of claim 11, wherein said set of parameters is selected from the group consisting of film thickness, substrate doping level, buried layer doping level and transition thickness.

13. A computer-implemented method of evaluating a wafer film using a film thickness monitor to determine a characteristic of a sample wafer, comprising;

generating a measured spectrum for said sample wafer film;

choosing an initial set of wafer parameters;

using said initial set of wafer parameters to generate a calculated spectrum;

comparing said measured spectrum and said calculated spectrum in order to calculate a difference;

varying at least one value in said initial set of parameters to generate a revised calculated spectrum until said difference is minimized;

determining a residual error value based on said minimized difference;

determining that said measured spectrum and said revised calculated spectrum having said minimized difference do not match within an acceptable residual error value range; and determining that said wafer film formed on said sample wafer has a defective surface quality based on said match.

14. The computer-implemented method of claim 13, wherein the wafer film is selected from the group consisting of epitaxial silicon, undoped polysilicon, doped capped polysilicon, undoped capped polysilicon and silicon germanium.

15. The computer-implemented method of claim 13, wherein a parameter of said initial set of wafer parameters is selected from the group consisting of film thickness, substrate doping level, buried layer doping level and transition thickness.

16. A computer-implemented method for evaluating a wafer film, comprising:

utilizing a film thickness monitor;

generating a measured spectrum for said wafer film with said film thickness monitor;

choosing a starting set of wafer parameters;

using said starting set of wafer parameters to generate a calculated spectrum;

determining a difference between said measured spectrum and said calculated spectrum;

choosing one or more different values for said starting set of wafer parameters;

generating a revised calculated spectrum from said different values;

determining a difference between said measured spectrum and said revised calculated spectrum;

continuing to select different parameter sets;

continuing to generate revised calculated spectrums until said differences between said revised calculated spectrum and said measured spectrum are minimized;

determining whether said minimized differences between said measured spectrum and said revised calculated spectrum match well to each other; and determining a film thickness of said wafer film using said film thickness monitor; and determining a surface quality of said wafer film based on said match.

* * * * *